Figure 1:
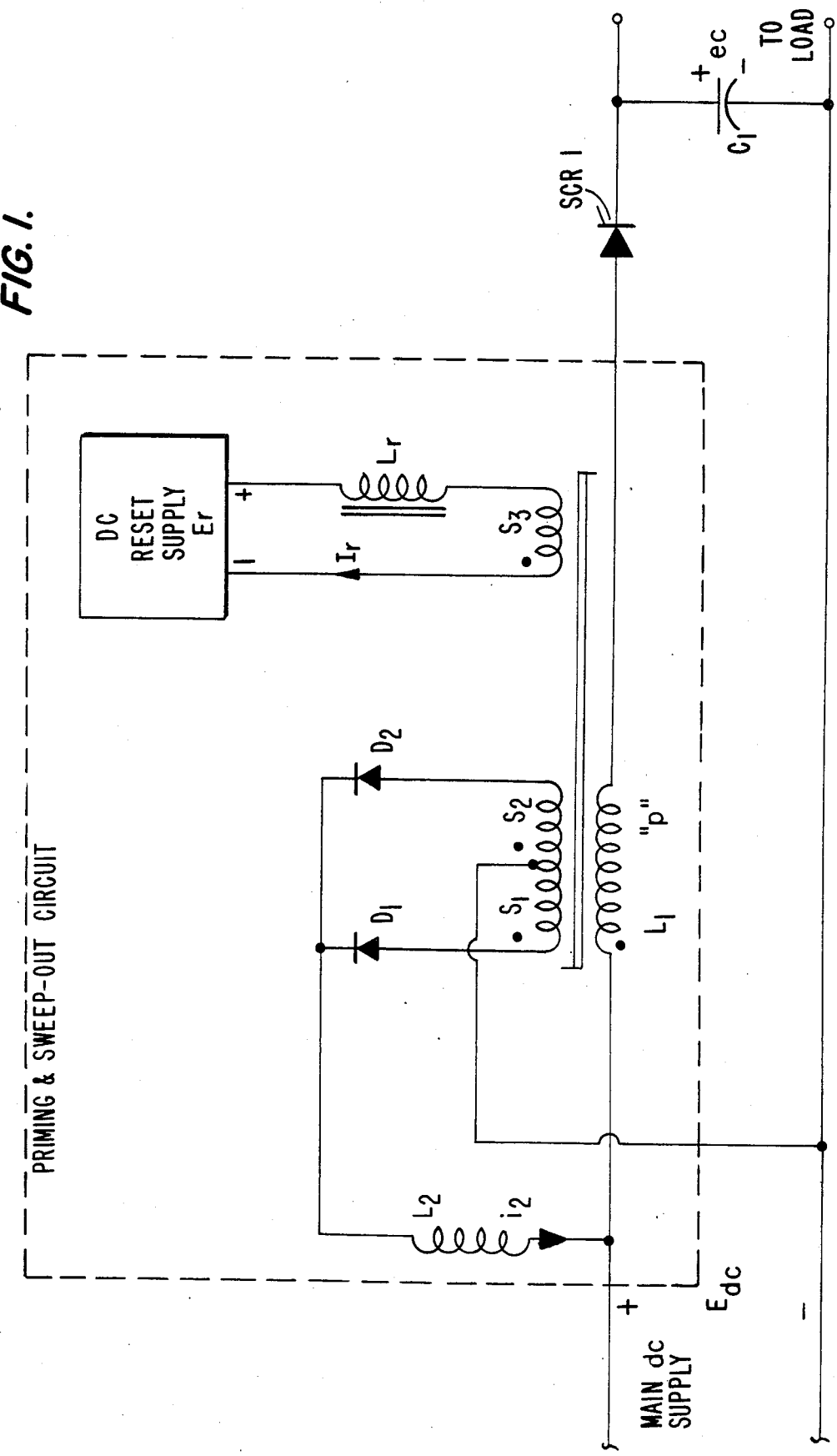

United States Patent [19]

Ver Planck

[11] Patent Number: 4,674,022

[45] Date of Patent: Jun. 16, 1987

[54] SCR PRIMING AND SWEEP-OUT CIRCUIT APPARATUS

[75] Inventor: Peter Ver Planck, Sudbury, Mass.

[73] Assignee: Megapulse, Inc., Bedford, Mass.

[21] Appl. No.: 880,713

[22] Filed: Jul. 1, 1986

[51] Int. Cl.[4] .................. H03K 17/72; H03K 17/292; H03K 17/13

[52] U.S. Cl. ........................................ 363/57; 363/91; 307/252 J; 307/252 M; 361/204; 361/205

[58] Field of Search ...................... 363/57, 82, 90, 91, 363/124; 323/289; 307/252 R, 252 J, 252 M, 252 N, 305, 106–108; 361/59, 204, 205; 328/67; 331/165, 166

[56] References Cited

U.S. PATENT DOCUMENTS

| | | | |
|---|---|---|---|
| 3,711,725 | 1/1973 | Johannessen | 307/108 |
| 3,786,334 | 1/1974 | Johannessen | 307/108 X |
| 3,832,573 | 8/1974 | Ver Planck et al. | 307/252 M X |
| 3,849,670 | 11/1974 | Lourigan | 307/108 |
| 3,889,263 | 6/1975 | Johannessen | 331/165 X |
| 4,001,598 | 1/1977 | Johannessen | 307/106 |
| 4,060,757 | 11/1977 | McMurray | 363/57 |
| 4,230,955 | 10/1980 | Johannessen | 307/252 J |
| 4,266,148 | 5/1981 | Wickson | 307/252 J |

Primary Examiner—Patrick R. Salce
Assistant Examiner—Emanuel Todd Voeltz
Attorney, Agent, or Firm—Rines and Rines Shapiro and Shapiro

[57] ABSTRACT

An improved priming and sweep-out circuit in which losses are obviated or minimized by transferring energy resulting from such processes back to the power supply, and wherein a single common storage inductance is used in a secondary winding circuit of a saturable-core inductor transformer, the primary of which is series-connected in the SCR-switching energy storage and discharge pulse generating circuit, to serve both in the priming and sweep-out functions, and wherein reset circuit inductance does not participate in the energy transfer or storage functions.

5 Claims, 7 Drawing Figures

SCR PRIMING AND SWEEP-OUT CIRCUIT APPARATUS

The present invention relates to SCR-controlled or similar energy-switching circuits, hereinafter generically referred to as SCR switching devices or means, and more particularly to improved circuits for reducing losses and reverse-voltage transients in prior priming and carrier sweep-out networks.

In U.S. Pat. No. 4,230,955 of common assignee herewith, a significant improvement in obviating dissipation losses in both the saturable inductor "priming" of SCR switching devices and in minority carrier "sweep-out" circuits that limit reverse current in SCR switching is disclosed, such improvement residing in the transferring of energy resulting from each of the priming process and the sweep-out process back to the power supplies by respective saturable inductor networks, these networks actively participating in energy exchange and storage functions in the resetting process (FIG. 4). While this has been found in practice admirably to solve these loss problems, the embodiments therein taught require the two separate function saturable inductors—one required to control the priming, and the other sweep-out.

In accordance with the present invention, on the other hand, it has been found possible to control both functions with a single saturable inductor network and without the resetting network participating in energy exchange or serving as a storage inductor, as in said patent, with significant resulting simplification and reduction in cost and efficiency improvement, as later more fully explained.

An object of the present invention, accordingly, is to provide a new and improved saturable inductor circuit apparatus for SCR priming and sweep-out circuit loss and reverse voltage transient elimination that has the above and other advantages.

Other and further objects are explained hereinafter and are more fully delineated in the appended claims.

In summary, however, from one of its view points, the invention embraces a priming and sweep-out circuit for an SCR pulse generator comprising saturable-core inductor means for enabling energy storing and discharging under the control of the gating of series-connected SCR-switching means, said circuit having, in combination, secondary winding means transformer-coupled with said saturable-core inductor means and connected at each of its terminals through respective diode means and storage inductance to one side of a D.C. power supply, the other side of the supply being connected to an intermediate terminal of said secondary winding means. Preferred and best mode embodiment and details are later discussed.

Figure 2A:
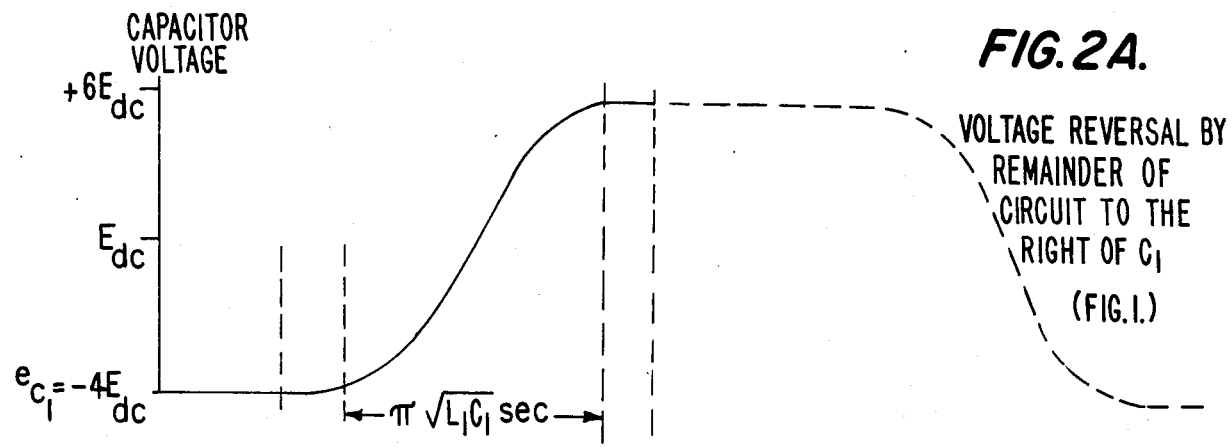
Figure 2B:
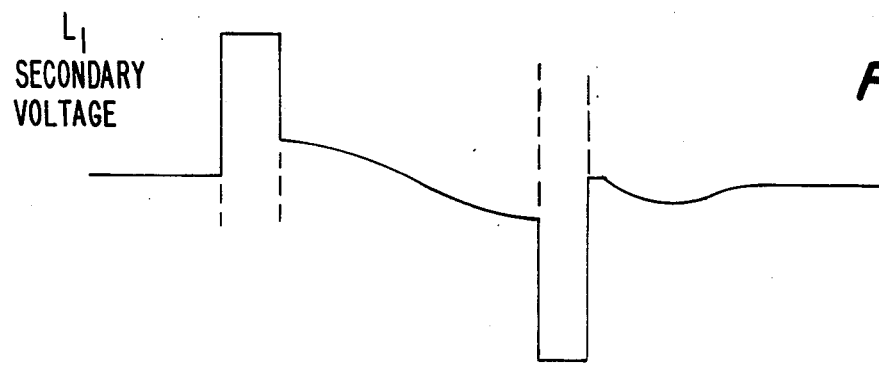
Figure 2C:
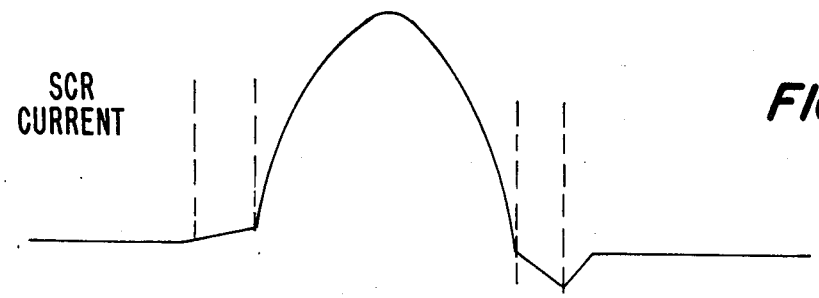
Figure 2D:
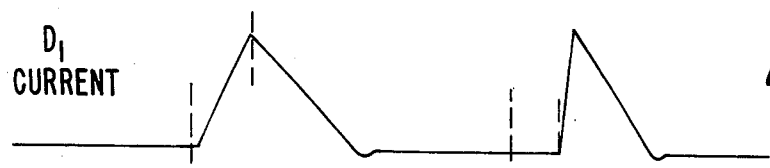
Figure 2E:
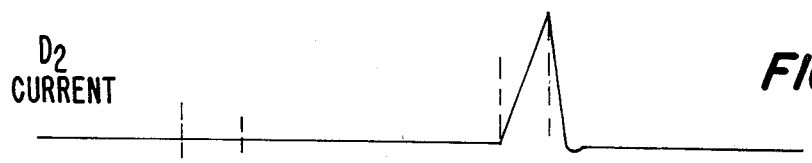
Figure 2F:
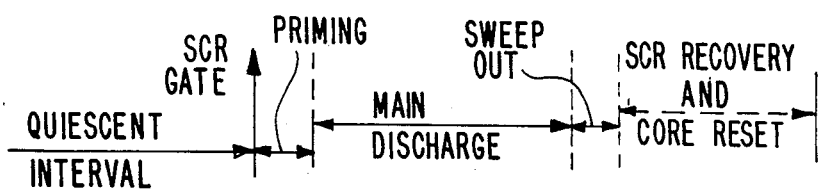

The invention will now be described with reference to the accompanying drawing,

FIG. 1 of which is a circuit diagram illustrating the invention in preferred form; and FIGS. 2A through 2E are waveform diagrams and FIG. 2F a timing diagram explanatory of the operation of FIG. 1.

FIG. 1 illustrates a portion of an SCR pulse generator which utilizes the invention. The pulse generator employs the well known resonance charging principle employing a saturable-core inductor $L_1$ to deliver half-sinusoidal pulses of current from the D.C. power supply $E_{dc}$ to the capacitor $C_1$ and a load circuit, labelled "LOAD", which may be a resistor, a saturable-magnetic pulse compressor, another SCR circuit, etc. The saturable-core inductor $L_1$ serves as the primary winding "p" of a transformer the secondary winding $S_1$–$S_2$ of which is coupled to the primary and is connected at its terminals to respective diodes $D_1$ and $D_2$, and from its intermediate tap to the − terminal or side of $E_{dc}$. The common terminals of the diodes $D_1$ and $D_2$ are connected through a storage inductance $L_2$ to the + side of the D.C. power supply $E_{dc}$.

The current pulse begins when a series-connected $SCR_1$ is gated at time t=0, FIGS. 2C and 2F, and continues for half a resonant period with $t = \pi\sqrt{L_1 C_1}$ seconds, when the natural oscillation reverses the direction of current through $SCR_1$ and turns $SCR_1$ off. At turn-off, the positive voltage $e_{11}$ on the capacitor exceeds $E_{dc}$, so that a net reverse voltage appears across $SCR_1$. The SCR will regain its forward voltage-blocking capability after a few 10's of microseconds of reverse bias. Once $SCR_1$ has recovered, the charged capacitor is isolated from the charging circuits, and its energy can be delivered to the load. Often, a negative voltage $e_{c1}$ will remain on $C_1$ following the discharge into the load circuit. This negative voltage adds to the power supply voltage in driving the natural oscillation of inductor $L_1$ and $C_1$ when $SCR_1$ is gated. In "lossless" resonant charging, the capacitor voltage reaches a positive level which is twice the power supply voltage plus the negative of the residual capacitor voltage. Thus the peak-to-peak capacitor voltage during steady-state operation of the pulse generator may be many times the D.C. supply voltage $E_{dc}$, shown as 6 $E_{dc}$ in FIG. 2A. The half-sinusoidal current pulses passing through $SCR_1$, FIG. 2C, are correspondingly large, often reaching thousands of amperes.

The current-carrying and current-switching capability of an SCR is limited by the rise in junction temperature caused by resistive dissipation. Resistive losses are particularly high just after gating when the entire circuit voltage is applied to the small conducting area of the junction near the gate, and at turn off when the minority carriers stored in the junction are swept out by reverse voltage, and the conducting junction area contracts to zero. The circuit configuration of FIG. 1 provides the designer with a means of reducing the rate-of-change of SCR current (di/dt) during the critical turn-on and turn-off intervals. The circuit produces a large increase in the charging inductance above its saturated value $L_1$ during the two critical intervals, thereby reducing di/dt. At turn-on, the SCR junction is "primed" with a small ramp of current which expands the conducting junction area prior to the main current pulse. At turn-off, the SCR current in the reverse direction is similarly restrained while the reverse circuit voltage "sweeps out" the minority carriers stored in the conducting junction (see "Timing diagram", FIG. 2F) The reverse current terminates very rapidly, and the resulting di/dt in the associated circuit inductance causes a transient pulse of reverse voltage across the now insulating SCR junction. The reverse-current restraint provided by the circuit of FIG. 1 keeps this transient small, and obviates the need for prior art series RC snubber networks across the SCR with attendant loss.

Returning to FIG. 2A illustrating the capacitor voltage $e_{c1}$ following the gating of $SCR_1$, the previous discharge of $C_1$ through the load reversed its voltage from a positive level of $6E_{dc}$ to a negative level of $-4E_{dc}$, similar to that indicated by the dotted line to the right.

These voltage levels are arbitrary, and serve only to illustrate the basic law of resonant charging mentioned above. Another initial condition is the magnetic state of the saturable core of inductor $L_1$. As indicated by the dots and the polarity or direction of the reset current $I_r$ in FIG. 1, the core of $L_1$ is fully reset between discharge cycles from a D.C. reset supply $E_r$ connected through $L_r$ to a reset secondary winding $S_3$ coupled to $L_1$ as a transformer. The reset inductance $L_r$ and the turns ratios of the windings on $L_1$ are adjusted such that the reset current $I_r$ remains essentially constant during the operating cycle to be described. The energy exchange during SCR priming and sweep-out, which is the feature of the invention, occurs across the saturable core transformer windings of $L_1$-$S_1$-$S_2$ into and out of the relatively small storage inductor $L_2$, via diodes $D_1$ and $D_2$. While the core of the saturable inductor is unsaturated, the wound core behaves like a closely coupled transformer. When saturation occurs, the mutual coupling between primary and secondary windings $L_1$ and $S_1$-$S_2$ largely disappears.

Prior to the gate pulse at time $t=0$, FIG. 2F, SCR$_1$ has a forward voltage of, say, $5E_{dc}$ applied to it. When the gating occurs, the resistance of the SCR junction collapses almost instantly to near zero, and the $5E_{dc}$ circuit voltage transfers to the "p"-turn primary of the saturable inductor $L_1$. Since the core is unsaturated in the dotted direction (FIG. 1) in which the voltage is applied transformer action occurs to the secondary $S_1$, FIG. 2B, across which an induced voltage $5E_{dc}$ ($S_1/p$ turns ratio) appears. Diode $D_2$ is back-biased, diode $D_1$ is forward-biased, and a net voltage $(5(S_1/p)-1)E_{dc}$ is applied to the storage indicator $L_2$. Since for an inductor the terminal voltage $E = L^{di}/dt$, the current passing into the power supply through secondary $S_1$, diode $D_1$ and $L_2$ will rise at a rate given by:

$$\frac{di_2}{dt} = \frac{1}{L_2}\left[\left(\frac{S_1}{p}\right)5 - 1\right]^{E_{dc}}$$

Via the transformer action of the saturable inductor, a similar rising current ($p/S_1$) times as large will pass through the primary "p", SCR$_1$ and into the load capacitor.

As shown in FIGS. 2C, 2B and 2D, the linear rises respectively in the storage inductor current $i_2$ and the SCR current continue until the square-loop core of $L_1$ saturates abruptly at time $t_1$, FIG. 2F. By design, the SCR current at the end of the priming interval (0 to $t_1$) is a few tens of amperes; small compared to the thousands of amperes of main-pulse SCR current to follow, but enough to promote enlargement of the conducting junction area in the SCR. When the core saturates, the mutual coupling beteen the primary and secondaries "p" ($L_1$)-$S_1$-$S_2$ is abruptly reduced, as indicated in FIG. 2B. On the primary side, all the circuit voltage (slightly under $5E_{dc}$) is applied to the saturated inductance $L_1$ of the primary winding, and the main-current sinusoidal re-charge of the load capacitor occurs over an interval of $\pi\sqrt{L_1C_1}$ seconds.

Back on the secondary side, at time $t_1$, the main circuit voltage coupled from the primary nearly disappears, leaving the (transformed) SCR priming current passing through the storage inductor $L_2$, the diode $D_1$, the small saturated inductance of secondary $S_1$, and into the power supply $E_{dc}$. This loop current into the power supply falls to zero at a rate of approximately $$(di_2/dt) \simeq -(E_{dc}/L_2),$$

and accomplishes the desired end of returning the (transformed) SCR priming energy stored in $L_2$ to the power supply. By this design of the saturable inductor $L_1$, the primary-to-secondary coupling is small during the saturated interval $t_1$ to $t_2$, FIG. 2F, so that only a minor amount of the main discharge energy gets diverted into $L_2$, unlike the action of the circuit of said patent. The return of priming energy through $d_1$ is their completed well before the main discharge terminates at $t_2$, as shown in FIG. 2D.

Similar circuit behavior occurs when the main resonant discharge current approaches zero on its way down from the pulse peak. The circuit voltage applied across the still-saturated primary $L_1$ of the saturable inductor is now negative with respect to the dots (FIG. 1) because the main-pulse $di/dt$ is negative. When the core of $L_1$ is pulled out of forward saturation, the entire circuit voltage (now $6E_{dc}$ from $C_1$ minus $E_{dc}$ from the power supply $= 5E_{dc}$) appears across the primary of $L_1$ in the negative direction, FIG. 2B. A current ramp into the power supply $E_{dc}$ is now initiated on the secondary side via secondary $S_2$, diode $D_2$ and storage inductor $L_2$. The SCR sweep-out interval starts when the primary current goes negative. So long as there are minority carriers remaining in the SCR junction, the voltage drop across the SCR remains low, the rising portion of the current ramp backwards through the SCR, and the corresponding secondary current ramp through $D_2$ persist, FIG. 2E. By design, the core of $L_1$ does not saturate in the reset direction before the reverse SCR junction current terminates at SCR turn-off. As turn-off begins, the SCR reverse current tapers rapidly toward zero, causing the primary $di/dt$ in the saturable inductor to go from negative back to positive. In response, the storage inductor current transfers rapidly from $D_2$ to $D_1$ at a rate limited by the leakage inductance between secondaries $S_2$ and $S_1$, as shown in FIGS. 2D and 2E. For a short time, both diodes $D_1$ and $D_2$ conduct at once, shorting the secondary of $L_1$. Simultaneously, the SCR junction is rapidly regaining its reverse voltage-blocking capability, thereby removing the circuit voltage applied to the primary of $L_1$. The diode $D_1$ and the storage inductor $L_2$ are left carrying a transformed replica of the SCR sweep-out current into the power supply. As in the priming case, this current flow is opposed by $E_{dc}$, and the sweep-out energy is returned to the power supply. When conduction through $D_1$ ceases, only the reset current is left applying-magneto motive force to the saturable core. As shown in FIG. 2B, at the end of the secondary voltage waveform, a small relatively long pulse of voltage occurs as the core is reset.

A useful feature of the circuit in FIG. 1 is that the two secondary windings $S_1$-$S_2$ on the saturable core need not have the same number of turns. A successful circuit of this type, for example, has used turns ratios of 12:5 for the priming circuit portion and 12:7 for the sweep-out. Thus the effective inductance referred to the primary during SCR priming can be different from that present during sweep-out, so that a measure of design independence exists between the peak priming circuit and the peak sweep-out current. An alternate circuit without this independence may use a center-tapped secondary with $S_1=S_2$, or a conventional full-wave four-diode bridge across a single secondary (not shown).

Thus circuit of FIG. 1 of the invention has some common objectives to that of the earlier-mentioned patent (FIG. 4 thereof) in (a.) reduction of SCR losses during turn-on and turn-off by reducing the voltage applied to the SCR in these critical intervals and (b.) accomplishing (a.) with much less dissipative loss than in prior-art circuits with resistors. A collateral advantage is that of substantial elimination of the reverse-voltage transient which occurs when $SCR_1$ turns off. The usual remedy, as before mentioned, is a series RC snubber networks across $SCR_1$, but these burn up a lot of power. Both circuits, moreover, reduce circuit di/dt at turn-off, so that the transient voltages, which are proportional to $L_1$ di/dt, are correspondingly less. Thus, among the more important and novel contributions of the present invention and its new circuit are the eliminating of one of the expensive and lossy saturable inductors, and the accomplishing of the return of priming and sweep-out energy to the power supply immediately. In the patent circuit, the reset inductor ($L_3$) retains the priming energy through the whole charging interval, causing some power loss (in $R'_1$). With the present invention, FIG. 1, the second inductor $L_2$ is but a small and inexpensive inductance as is reset inductor $L_r$, which advantageously does not participate in energy exchange or storage, as earlier explained.

Thus, FIG. 1 enables a single, common saturable inductance network to serve both the priming and sweep-out circuit needs of the SCR switching charging (or storage) and discharging energy-supply main circuit. If desired, a pair of such circuits may be used in push-pull, each with a saturable inductor (transformer) network $L_1-S_1-S_2$ as above described. Further modifications will also occur to those skilled in this art and are considered to fall within the spirit and scope of the invention as defined in the claims.

What is claimed is:

1. A priming and sweep-out circuit for an SCR pulse generator comprising saturable-core inductor means for enabling energy storing and discharging under the control of the gating of series-connected SCR-switching means, said circuit having, in combination, secondary winding means transformer-coupled with said saturable inductor means and connected at each of its terminals through respective diode means and storage inductance to one side of a D.C. power supply, the other side of the supply being connected to an intermediate terminal of said secondary winding means.

2. A priming and sweep-out circuit as claimed in claim 1 and in which said saturable-core inductor means is further transformer coupled to a further winding to provide re-set current through a further reset inductance.

3. A priming and sweep-out circuit as claimed in claim 1 and in which means is provided for causing the storage inductance means to receive a ramp of current through one of the diode means upon gating on of the SCR-switching means, with a similar current ramp flowing through the SCR switching means to provide priming until saturation of said saturable-core inductor means which causes the current to vanish to zero and passes current from the said storage inductance into the said power supply; and means operable as the current nears zero and the said saturable-core inductor means comes out of saturation during discharge current reversal for developing a further ramp current through the other diode means, the storage inductance and into said power supply, to sweep minority carriers out of the SCR junction and prevent reverse-voltage transients until the SCR switching means recovers and turns off.

4. A priming and sweep-out circuit as claimed in claim 3 and in which the turns ratios of the saturable-core inductor means and the secondary winding means on each side of said intermediate terminal thereof are of the order of about 12:7 and 12:5.

5. A priming and sweep-out circuit as claimed in claim 1 and in which reset circuit inductance is provided, coupled in a manner such that it does not substantially participate in energy storage and transfer functions in said priming and sweep-out circuit.

* * * * *